United States Patent
Tajiri

(10) Patent No.: US 8,456,552 B2
(45) Date of Patent: Jun. 4, 2013

(54) IMAGE PICK UP UNIT USING A LENS ARRAY INCLUDING A PLURALITY OF LENS SECTIONS CORRESPONDING TO M×N PIXELS OF IMAGE PICKUP DEVICE

(75) Inventor: Shinichiro Tajiri, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/284,186

(22) Filed: Oct. 28, 2011

(65) Prior Publication Data
US 2012/0113302 A1    May 10, 2012

(30) Foreign Application Priority Data

Nov. 5, 2010  (JP) ................................ 2010-248398

(51) Int. Cl.
*H04N 9/04* (2006.01)
*H04N 5/225* (2006.01)
(52) U.S. Cl.
USPC ........................................ 348/273; 348/340
(58) Field of Classification Search
None
See application file for complete search history.

(56) References Cited

U.S. PATENT DOCUMENTS

| 7,394,059 B2* | 7/2008 | Fukuyoshi et al. | 250/226 |
| 2009/0128658 A1* | 5/2009 | Hayasaka et al. | 348/222.1 |
| 2009/0128669 A1* | 5/2009 | Ng et al. | 348/241 |
| 2010/0289035 A1* | 11/2010 | Muschaweck et al. | 257/84 |

FOREIGN PATENT DOCUMENTS

WO     2006-039486     4/2006

OTHER PUBLICATIONS

Light Field Photography with a Hand-Held Plenoptic Camera, Stanford University Computer Science Tech Report CTSR 2005-02, Ren Ng, Apr. 2005, pp. 1-13.

* cited by examiner

*Primary Examiner* — Luong T Nguyen
(74) *Attorney, Agent, or Firm* — K&L Gates LLP

(57) ABSTRACT

An image pickup unit includes an image pickup lens, a lens array disposed on an image formation plane of the image pickup lens, and an image pickup device having a plurality of pixels arranged two-dimensionally along first and second directions intersecting each other. The lens array includes a plurality of lens sections each being assigned to a region of m-by n-pixel in the image pickup device, where each of m and n is an integer of 1 or more, and m is different from n.

6 Claims, 10 Drawing Sheets

FIG. 5A

| R | R | R | G | G | G | R | R | R |
|---|---|---|---|---|---|---|---|---|
| G | G | G | B | B | B | G | G | G |
| R | R | R | G | G | G | R | R | R |
| G | G | G | B | B | B | G | G | G |
| R | R | R | G | G | G | R | R | R |
| G | G | G | B | B | B | G | G | G |

FIG. 5B

| R | G | R | G | B | G | R | G | R |
|---|---|---|---|---|---|---|---|---|
| G | R | G | B | G | B | G | R | G |
| R | G | R | G | B | G | R | G | R |
| G | R | G | B | G | B | G | R | G |
| R | G | R | G | B | G | R | G | R |
| G | R | G | B | G | B | G | R | G |

FIG. 15A

| R | G | G | B | R | G | G | B |
| G | R | B | G | G | R | B | G |
| R | G | G | B | R | G | G | B |
| G | R | B | G | G | R | B | G |
| R | G | G | B | R | G | G | B |
| G | R | B | G | G | R | B | G |
| R | G | G | B | R | G | G | B |
| G | R | B | G | G | R | B | G |

FIG. 15B

| R | R | G | G | R | R | G | G |
| G | G | B | B | G | G | B | B |
| R | R | G | G | R | R | G | G |
| G | G | B | B | G | G | B | B |
| R | R | G | G | R | R | G | G |
| G | G | B | B | G | G | B | B |
| R | R | G | G | R | R | G | G |
| G | G | B | B | G | G | B | B |

IMAGE PICK UP UNIT USING A LENS ARRAY INCLUDING A PLURALITY OF LENS SECTIONS CORRESPONDING TO M×N PIXELS OF IMAGE PICKUP DEVICE

CROSS REFERENCES TO RELATED APPLICATIONS

The present application claims priority to Japanese Patent Application No. 2010-248398 filed on Nov. 5, 2010, the disclosure of which is incorporated herein by reference.

BACKGROUND

The present disclosure relates to an image pickup unit using a lens array.

Various image pickup units have been proposed or developed in the past. In some proposed image pickup units, image pickup data are subjected to predetermined image processing and then output. For example, WO 06/039486 and Ren. Ng et al. "Light Field Photography with a Hand-Held Plenoptic Camera", Stanford Tech Report CTSR 2005-02 propose an image pickup unit using a technique called "Light Field Photography". In the image pickup unit, a lens array is disposed on a focal plane of an image pickup lens, and furthermore an image sensor is provided on a focal plane of the lens array. This allows the image sensor to receive a picture of an object formed on the lens array while the picture is divided into beams in viewpoint directions, making it possible to acquire images from multiple viewpoints at a time.

SUMMARY

In the above image pickup unit, a plurality of pixels on the image sensor are set in correspondence to one lens of the lens array, namely, each of longitudinal and lateral dimensions of each lens is equal to an integral multiple of a pixel pitch, making it possible to acquire viewpoint images corresponding to the number of pixels set in correspondence to the lens. In addition, the number in a longitudinal direction of pixels set in correspondence to the lens is equal to the number in a lateral direction of the pixels, namely, a longitudinal dimension of the lens is equal to a lateral dimension thereof. For example, one lens is assigned to 3×3 pixels, or each of longitudinal and lateral dimensions of the lens is equal to a pitch for three pixels, and thus three viewpoint images may be acquired in each of longitudinal and lateral directions (nine viewpoint images in total). The images in respective viewpoint directions formed in this way (hereinafter, called viewpoint images) are shown using a predetermined display, making it possible to achieve, for example, stereoscopic image display.

However, in a typical display that may show a plurality of viewpoint images, the number of viewpoints in the longitudinal direction is often not equal to that in the lateral direction. For example, while the number of viewpoints is two or more in the lateral direction, the number is often one in the longitudinal direction. In such a display, appropriate viewpoint images are selected and displayed from the images corresponding to the 3×3 viewpoints. For example, when images from one viewpoint in the longitudinal direction and three viewpoints in the lateral direction, or 1×3 viewpoint images, are selectively displayed on the display, images from two viewpoints of the three viewpoints are not used in the longitudinal direction. Consequently, part of a plurality of viewpoint images formed using the above image pickup unit are useless.

In addition, resolution of each viewpoint image is equal to the quotient of resolution (the number of pixels) of the image sensor divided by the number of viewpoints (the number of lenses of the lens array). That is, the number of viewpoints of viewpoint images to be acquired and resolution of each image are in a trade-off relationship. As a result, when an unused viewpoint image exists, resolution of each viewpoint image is reduced.

It is desirable to provide an image pickup unit capable of acquiring desired viewpoint images while suppressing reduction in resolution.

According to an embodiment of the disclosure, there is provided an image pickup unit including an image pickup lens, a lens array disposed on an image formation plane of the image pickup lens, and an image pickup device having a plurality of pixels arranged two-dimensionally along first and second directions intersecting each other. The lens array includes a plurality of lens sections each being assigned to a region of m- by n-pixel in the image pickup device, where each of m and n is an integer of 1 or more, and m is different from n.

In the image pickup unit according to the embodiment of the disclosure, beams through the image pickup lens from an object are divided in viewpoint directions, and received by the image pickup device. The lens array includes the plurality of lens sections each assigned to the m×n pixel region, thereby m viewpoint images in the first direction and n viewpoint images in the second direction are acquired, namely, m×n viewpoint images in total are acquired.

According to the image pickup unit of the embodiment of the disclosure, the image pickup lens and the image pickup device having the plurality of pixels arranged two-dimensionally are provided, and the lens array, including the plurality of lens sections each being assigned to a region of m- by n- pixel, is provided on the image formation plane of the image pickup lens, making it possible to properly acquire only a necessary number of viewpoint images. In the viewpoint images, since the number of viewpoints and resolution are in a trade-off relationship, the number of useless viewpoint images is reduced, making it possible to suppress reduction in resolution. That is, desired viewpoint images may be acquired while reduction in resolution is suppressed.

It is to be understood that both the foregoing general description and the following detailed description are exemplary, and are intended to provide further explanation of the technology as claimed.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 5A and 5B are schematic views each illustrating an example of a color arrangement of a color filter.

FIGS. 15A and 15B are schematic views each illustrating a color arrangement of a color filter according to modification 3.

Additional features and advantages are described herein, and will be apparent from the following Detailed Description and the figures.

DETAILED DESCRIPTION

Embodiments of the present application will be described below in detail with reference to the drawings.

Hereinafter, a preferred embodiment of the disclosure will be described in detail with reference to drawings. Description is made in the following order.

1. Embodiment (an example where 1×3 pixels are set in correspondence to a lens, and long-shaped convex lenses are provided on a light incident surface of a lens array and on a light exiting surface thereof)
2. Modification 1 (an example where a lens array is configured of toroidal lenses)
3. Modification 2 (an example where a lens array is directly formed on an image sensor)
4. Modification 3 (an example of a color filter in the case that 1×2 pixels are set in correspondence to a lens)

[Embodiment]
[General Configuration]

Figure 1:
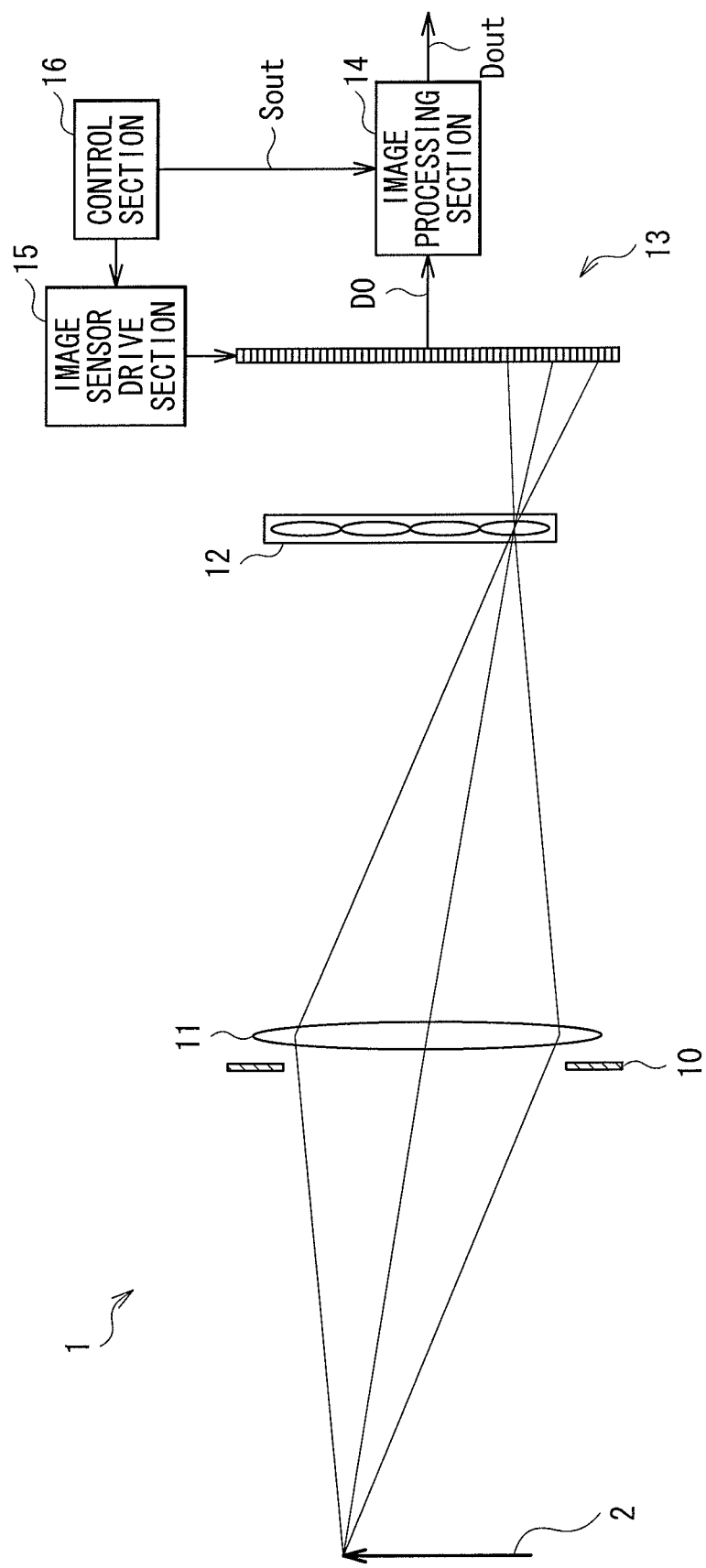
FIG. 1 illustrates a general configuration of an image pickup unit according to an embodiment of the disclosure.

FIG. 1 illustrates a general configuration of an image pickup unit (image pickup unit 1) according to an embodiment of the disclosure. The image pickup unit 1 picks up an image of an object 2 and performs predetermined image processing to the image, and thus outputs image data Dout. The image pickup unit 1 includes an image pickup lens 11, a lens array 12, an image sensor 13, an image processing section 14, an image sensor drive section 15, and a control section 16. Hereinafter, while an optical axis is assumed as Z, a horizontal direction (lateral direction) is assumed as X and a vertical direction (longitudinal direction) is assumed as Y in a plane orthogonal to the optical axis Z.

The image pickup lens 11 is a main lens for picking up an image of the object 2, and, for example, configured of a typical image pickup lens used for a video camera or a still camera. An aperture diaphragm 10 is disposed on a light incident side (or light exiting side) of the image pickup lens 11.

(Configuration of Lens Array 12)

The lens array 12 is disposed on a focal plane (image formation plane) of the image pickup lens 11, and, for example, has a plurality of lens sections (lens sections 12L described later) on a substrate such as glass substrate. Each of the lens sections is assigned to a predetermined pixel region of the image sensor 13, specifically, an m×n pixel region, where m and n are integers of 1 or more different from each other. Hereinafter, description is made assuming that the lens sections are provided in correspondence to a pixel region where pixels are arranged by m=1 along the longitudinal direction Y and by n=3 along the lateral direction X. The image sensor 13 is disposed on the focal plane of the lens array 12.

Figure 2:
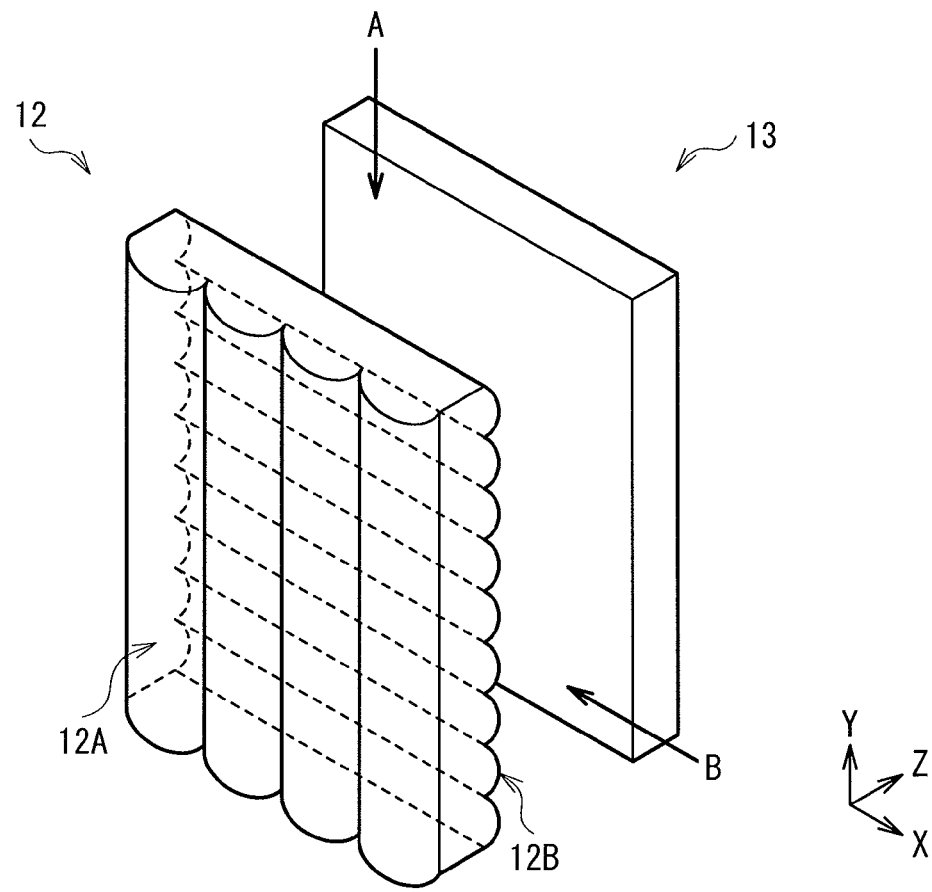
FIG. 2 is a schematic view illustrating a perspective configuration of a lens array and of an image sensor.
Figure 3A:
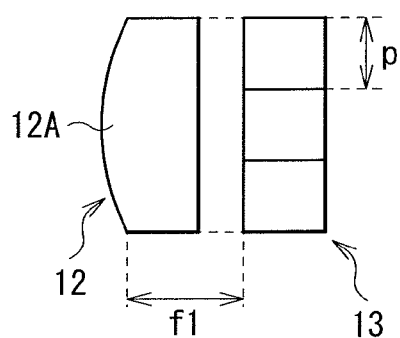
FIG. 3A is a side view from A in FIG. 2.
Figure 3B:
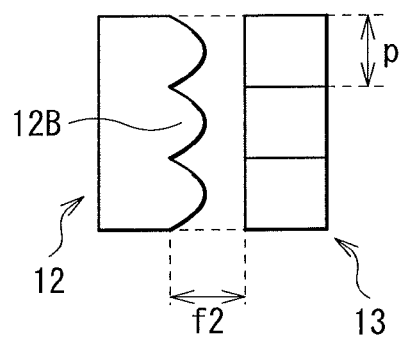
FIG. 3B is a side view from B therein.

FIG. 2 illustrates a perspective configuration of the lens array 12 with the image sensor 13. The lens array 12 has a plurality of long-shaped convex lenses 12A and 12B, which are orthogonal to each other and different in focal distance, on a surface on the light incident side (an image pickup lens 11 side) and a surface on the light exiting side (an image sensor 13 side), respectively. FIG. 3A is a side view showing the lens array 12 and the image sensor 13 as viewed from A in FIG. 2, and FIG. 3B is a side view showing the lens array 12 and the image sensor 13 as viewed from B in FIG. 2. The long-shaped convex lenses 12B are omitted in FIG. 3A, and the long-shaped convex lenses 12A are omitted in FIG. 3B.

Figure 4:
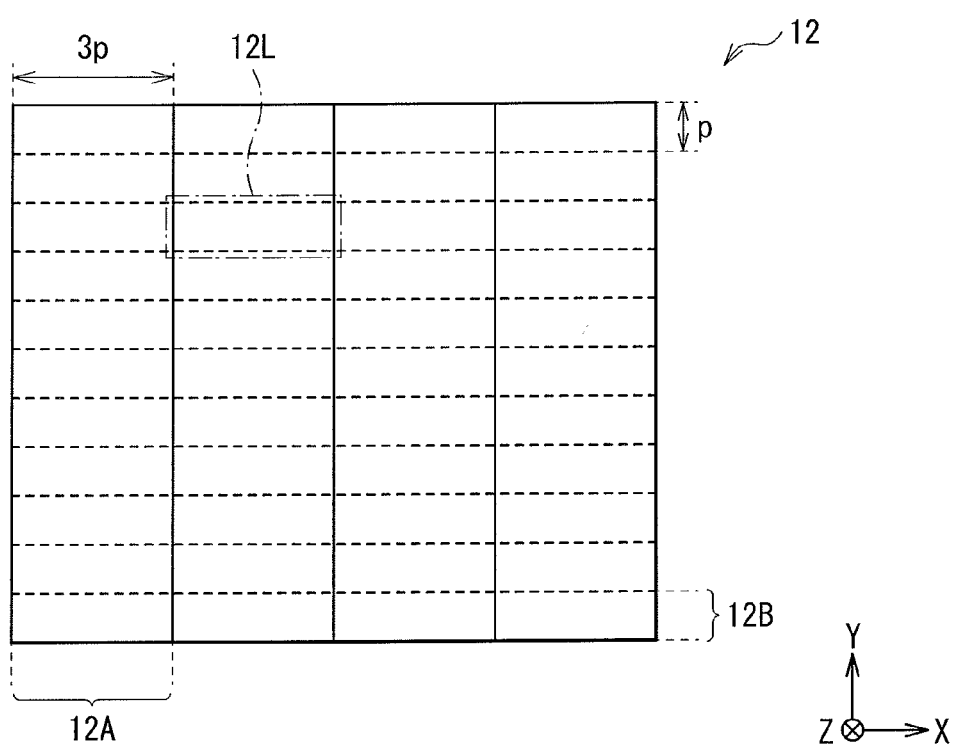
FIG. 4 is a schematic view illustrating a configuration of the lens array along an XY plane.

As shown in the figure, for example, each long-shaped convex lens 12A extends along the longitudinal direction Y, and has a width corresponding to three pixels (3 p) along the lateral direction X. For example, each long-shaped convex lens 12B extends along the lateral direction X, and has a width corresponding to one pixel (1 p) along the longitudinal direction Y. In the embodiment, a region corresponding to a crossing of the long-shaped convex lens 12A and the long-shaped convex lens 12B of the lens array 12 in the XY plane corresponds to a lens section 12L assigned to the m×n (1×3) pixel region (FIG. 4). In this way, the lens section 12L has a rectangular shape having an uneven aspect ratio (length:width=1:3) in the XY plane.

The above long-shaped convex lens 12A and 12B are configured of a resin material such as photoresist, and may be formed on both sides of a substrate including glass or plastic using, for example, a resist reflow method or nanoimprinting. In addition, the long-shaped convex lens may be formed by molding using a die.

Since the respective long-shaped convex lenses 12A and 12B are disposed on different surfaces of the lens array 12 and are different in focal distance, a position of the lens array 12 (relative position with respect to the image sensor 13) and thickness thereof (thickness of the substrate) are set in consideration of those. In detail, the focal distances f1 and f2 are expressed as the following expressions (2) and (3), respectively, where f-number of the image pickup lens 11 is represented as F, pixel width (pixel pitch) is represented as p, a focal distance of the long-shaped convex lens 12A is represented as f1, and a focal distance of the long-shaped convex lens 12B is represented as f2, and an expression (1) is derived from the expressions.

$$f1 = F \times n \times p \qquad (2)$$

$$f2 = F \times m \times p \qquad (3)$$

$$f1 = (n/m) \times f2 \qquad (1)$$

It is therefore preferable that a position and thickness of the lens array 12 be set to satisfy the expression (1). Here, since m×n=1×3 is given, the position and the thickness are set such that the focal distance f1 is three times as large as the focal distance f2.

The image sensor 13 receives beams from the lens array 12 and thus acquires image pickup data D0. In the image sensor 13, a plurality of pixels are two-dimensionally arranged in a matrix (along the longitudinal direction Y and the lateral direction X). Each pixel is configured of a solid image pickup unit such as CCD (Charge Coupled Device) or CMOS (Complementary Metal-Oxide Semiconductor). In the image sensor 13, an image of the object 2 is formed as an image having a similar figure to a shape of the aperture diaphragm 10 (for example, a circular shape) in a pixel region corresponding to two-dimensional coordinates of a microlens of the lens array 12.

One lens section 12L (a crossing of the long-shaped convex lenses 12A and 12B) of the lens array 12 is assigned to a pixel region configured of an arrangement of m×n pixels of the plurality of pixels. As a value of the m×n increases, namely, as the number of pixels set in correspondence to one microlens (hereinafter, called lens-corresponding-pixels) increases, the number of viewpoints of viewpoint images described later increases, for example. In contrast, as the number of lens-corresponding-pixels decreases (the value of the m×n decreases), the number of pixels for each viewpoint image (resolution) increases. In this way, the number of viewpoints of viewpoint images and resolution of each viewpoint image are in a trade-off relationship.

A color filter is provided on a light receiving surface of the image sensor 13. FIGS. 5A and 5B schematically illustrate an example of a color arrangement of the color filter. The color filter includes, for example, filters of respective colors of red (R), green (G), and blue (B) arranged at a ratio of 1:2:1 (Bayer arrangement). Specifically, one of R, G, and B may be disposed at every 1×3 pixel region (the same color in one pixel region) as illustrated in FIG. 5A, or respective colors may be disposed such that the same colors are not next to each other as illustrated in FIG. 5B. While Bayer arrangement is provided in both cases after image composition is performed for each of the viewpoints, a color arrangement is made such that the same color pixels are not next to each other as illustrated in FIG. 5B, suppressing crosstalk between beams in different viewpoint directions.

The image processing section 14 performs predetermined image processing on image pickup data D0 acquired by the image sensor 13, and, for example, outputs the image data Dout as viewpoint images. Specific image processing operation of the image processing section 14 will be described later.

The image sensor drive section 15 drives the image sensor 13 and controls an exposure of the image sensor 13 and reading from the image sensor 13.

The control section 16, which controls operation of each of the image processing section 14 and the image sensor drive section 15, is configured of, for example, a microcomputer.

[Operation and Effects]
(Acquisition of Image Pickup Data)

Figure 6:
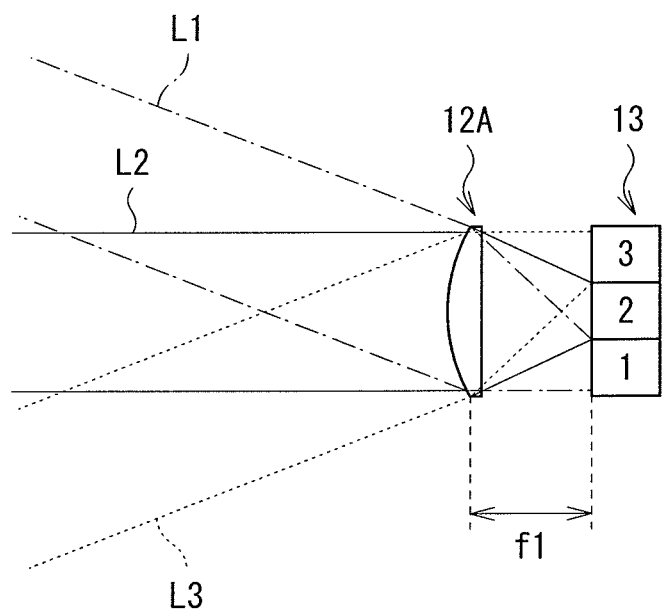
FIG. 6 is a schematic view for explaining beams divided in viewpoint directions.
Figure 7:
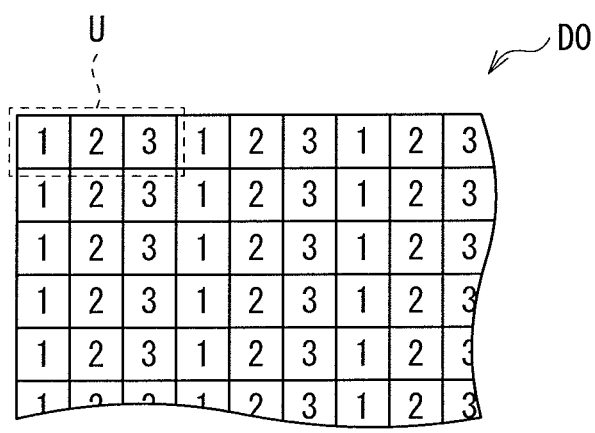
FIG. 7 is a schematic view showing image pickup data acquired by the image pickup unit illustrated in FIG. 1.

In the image pickup unit 1, the lens array 12 is provided at a predetermined position between the image pickup lens 11 and the image sensor 13, thereby the image sensor 13 records beams from the object 2 as beam vectors holding information of intensity distribution of the respective beams and advance directions (viewpoint directions) thereof. That is, beams through the lens array 12 are divided in viewpoint directions, and the respective divided beams are received by different pixels of the image sensor 13. For example, as illustrated in FIG. 6, among beams passing through the long-shaped convex lens 12A having a width corresponding to three pixels, a beam (light beam) L1 in a direction from a certain viewpoint (first viewpoint) is received by a pixel "1", and beams L2 and L3 in directions from other viewpoints (second and third viewpoints) are received by pixels "2" and "3", respectively. In FIG. 6, pixels are numbered for convenience. For example, the image sensor 13 line-sequentially reads data in response to drive operation by the image sensor drive section 15, and thus acquires the image pickup data D0. FIG. 7 schematically illustrates an arrangement of the image pickup data D0. As shown in the figure, each of the beams L1 to L3 in the three viewpoint directions is received by a pixel at a predetermined position in a 1×3 rectangular pixel region (unit region) U.

In addition, since the color filter is disposed on the light receiving surface of the image sensor 13 as illustrated in FIGS. 5A and 5B, the image pickup data D0 are recorded as color data corresponding to the color arrangement of the color filter. The image pickup data D0 acquired in the above way are output to the image processing section 14.

(Image Processing Operation)

Figures 8A, 8B, 8C:
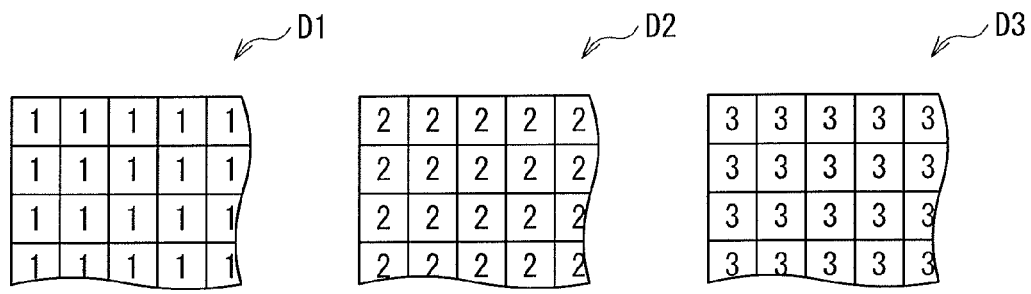
FIGS. 8A to 8C are schematic views each showing viewpoint image data obtained from the image pickup data illustrated in FIG. 7.

The image processing section 14 generates, for example, three viewpoint images on the basis of the image pickup data D0. Specifically, pixel data of a pixel at one position (here, a pixel at each of positions of "1", "2", and "3" in FIG. 7) are extracted for each of the unit regions U of the image pickup data D0, and the extracted pixel data are synthesized with one another. That is, a viewpoint image D1 (FIG. 8A) for a first viewpoint is generated through synthesis of the respective pixel data at the position "1", a viewpoint image D2 (FIG. 8B) for a second viewpoint is generated through synthesis of the respective pixel data at the position "2", and a viewpoint image D3 (FIG. 8C) for a third viewpoint is generated through synthesis of the respective pixel data at the position "3". After that, for example, color interpolation processing such as demosaic processing is performed to the three viewpoint images, so that color viewpoint images are output as the image data Dout. It is to be noted that the image processing section 14 may have, for example, a defect detection section, a clamp processing section, a defect correction section, a color interpolation section, a noise reduction processing section, a contour enhancement section, a white balance adjustment section, and a gamma correction section, none of which is illustrated.

Figure 9:
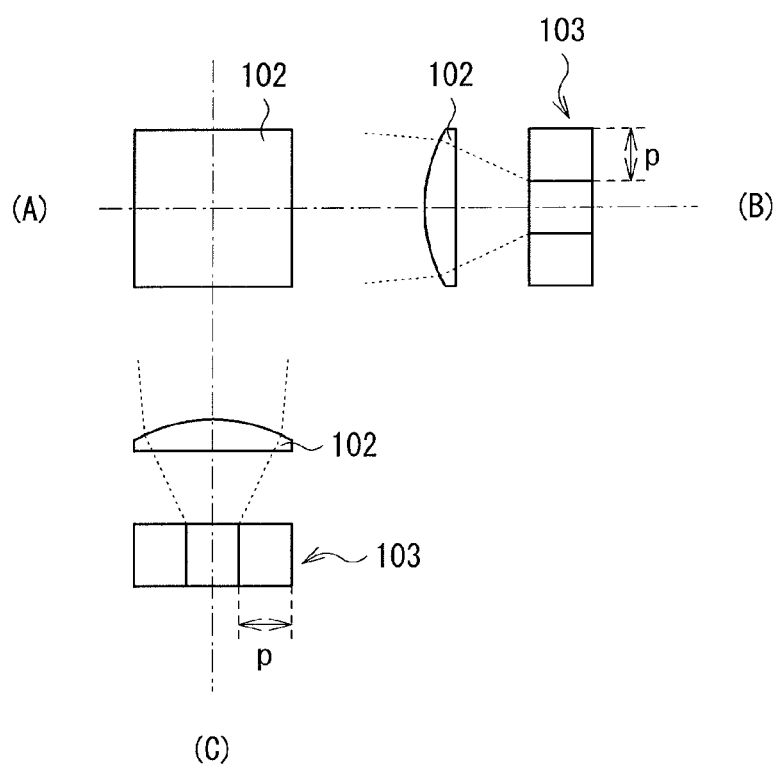
FIG. 9 is a schematic view of an arrangement of a lens and an image sensor according to comparative example 1.
Figure 10:
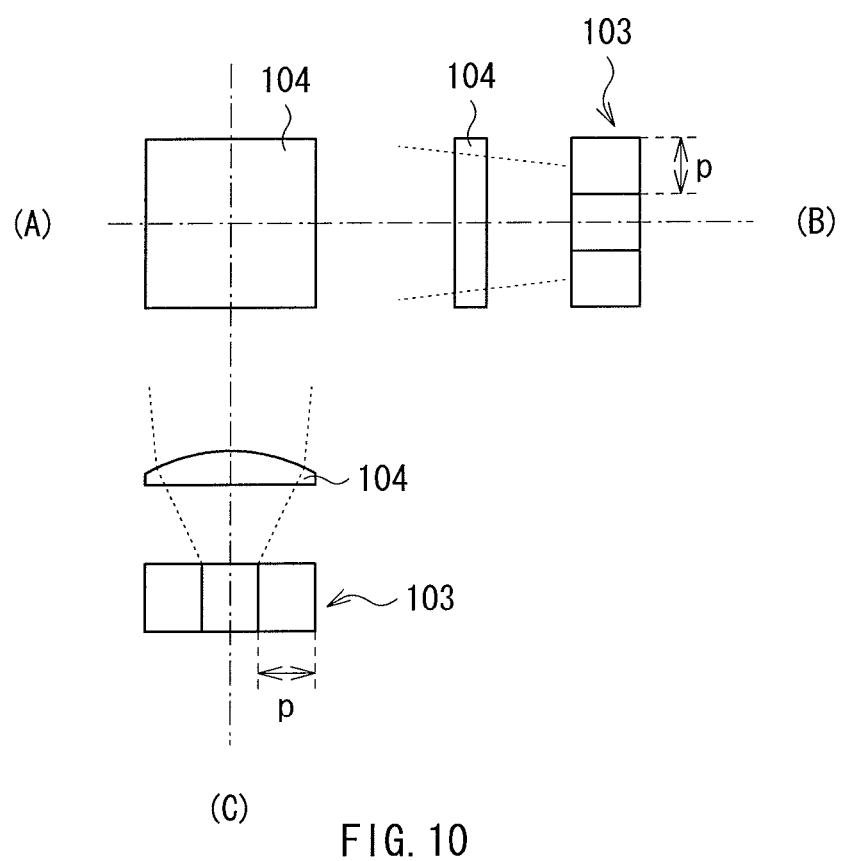
FIG. 10 is a schematic view of an arrangement of a lens and an image sensor according to comparative example 2.

FIGS. 9 and 10 schematically illustrate respective lens shapes according to comparative examples (comparative examples 1 and 2) of the embodiment. In the comparative example 1, for example, one lens 102 is assigned to a 3×3 pixel region as illustrated in (A) to (C) of FIG. 9. In FIG. 9, (A) illustrates a shape of the lens 102 along an XY plane, (B) illustrates an arrangement of the lens 102 and the image sensor 103 in a longitudinal direction, and (C) illustrates an arrangement thereof in a lateral direction. That is, in the comparative example 1, beams are divided in viewpoint directions using a lens having longitudinal and lateral dimensions equal to each other. Such a configuration makes it possible to acquire 3×3=9 viewpoint images in total, 3 viewpoints in the longitudinal direction and 3 viewpoints in the lateral direction.

However, the number of the viewpoints is typically different between the longitudinal and lateral directions in a display showing a plurality of viewpoint images. For example, the display often shows one viewpoint image in the longitudinal direction and two or more viewpoint images in the lateral direction. Consequently, the comparative example 1 uses only selective viewpoint images (for example, 1×3 viewpoint images) among the acquired, nine viewpoint images, and does not use remaining viewpoint images (for example, images for six viewpoints). Since the number of viewpoints (in this case, nine) of viewpoint images and resolution of each image are in a trade-off relationship as described before, resolution is reduced with increase in the number of viewpoints. It is therefore desirable that the number of useless viewpoint images be small.

Thus, a cylindrical lens is conceivably used as a lens 104 to decrease the number of viewpoints in the longitudinal direction as illustrated in (A) to (C) of FIG. 10. In FIG. 10, (A) illustrates a shape of the lens 104 along an XY plane, (B) illustrates an arrangement of the lens 104 and the image sensor 103 in the longitudinal direction, and (C) illustrates an arrangement thereof in the lateral direction. In this case, beams are divided in three viewpoint directions as in the comparative example 1 in the lateral direction. However, in the longitudinal direction, since beams are not refracted, or a refraction effect is small, a somewhat defocused image is formed on a light receiving surface.

In the embodiment, the lens array 12 has the long-shaped convex lenses 12A on the light incident surface of the lens array 12 and the long-shaped convex lenses 12B on the light exiting surface thereof, where each long-shaped convex lens 12A extends in the longitudinal direction Y, and has a width n times (here, three times) as large as pixel width in the lateral direction X, namely, exhibits a lens function with the focal distance f1 in the lateral direction X. In contrast, each long-shaped convex lens 12B extends in the lateral direction X, and has a width m times as large as (here, equal to) the pixel width in the longitudinal direction Y, namely, exhibits a lens function with the focal distance f2 in the longitudinal direction Y. In addition, a position and thickness of the lens array 12 are set such that the predetermined conditional expression (1) described above is satisfied. Accordingly, beams through the lens array 12 are divided in three viewpoints in the lateral direction X due to the effect of the long-shaped convex lens 12A, and received by respective, three pixels of the image sensor 13. In the longitudinal direction Y, beams are received by one pixel as a beam in a one viewpoint direction due to the effect of the long-shaped convex lens 12B. That is, respective beams through each lens section 12L of the lens array 12 (a crossing of the long-shaped convex lenses 12A and 12B) are received by the 1×3 pixel region. Thus, viewpoint images from one viewpoint in the longitudinal direction and from three viewpoints in the lateral direction may be generated without uselessness on the basis of the acquired image pickup data D0, as illustrated in FIGS. 7 and 8A to 8C.

As described above, in the embodiment, since the lens array 12 is disposed between the image pickup lens 11 and the image sensor 13, beams from the object 2 may be received while being divided in viewpoint directions. In the lens array 12, each lens section 12L is assigned to an m×n pixel region: the long-shaped convex lens 12A has a width corresponding to n pixels, and the long-shaped convex lens 12B has a width corresponding to m pixels. Consequently, beams through the lens array 12 are received by the m×n pixel region of the image sensor 13. That is, in the embodiment, even if a necessary number of viewpoints for a display is different between the longitudinal and lateral directions, for example, one in the longitudinal direction and three in the lateral direction, viewpoint images may be acquired without uselessness, making it possible to prevent reduction in resolution due to the useless viewpoint images. Accordingly, desired viewpoint images may be acquired while reduction in resolution is suppressed.

Figure 11:
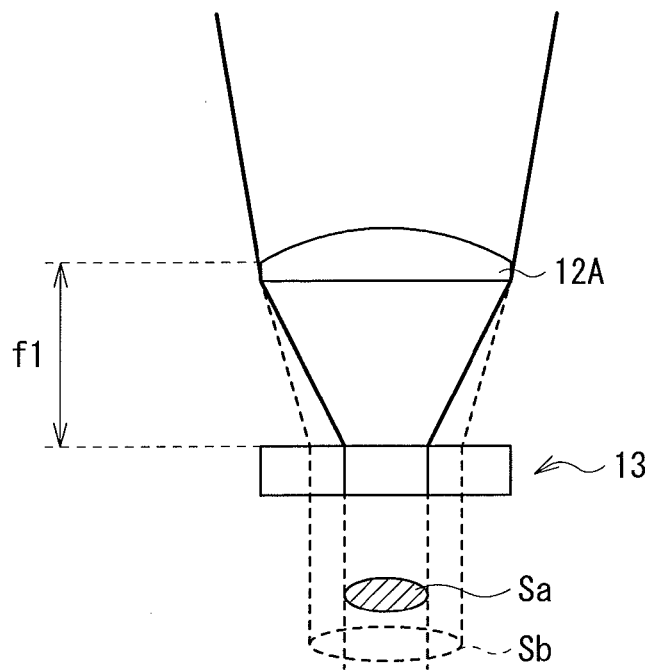
FIG. 11 is a schematic view for explaining an effect provided by a color filter arrangement.

In addition, the color filter is provided on the light receiving surface of the image sensor 13 such that colors are arranged to be different between adjacent pixels as illustrated in FIG. 5B, providing the following effect. That is, while light Sa having a desired wavelength is concentrated on a desired region, light Sb having a wavelength other than the desired wavelength may be not adequately concentrated because of chromatic aberration of a lens, as illustrated in FIG. 11. The color arrangement as illustrated in FIG. 5B is provided, thereby even if such light Sb is output, beam leakage to adjacent pixels may be suppressed, namely, color crosstalk may be suppressed between different viewpoint images.

Hereinafter, modifications of the embodiment (modifications 1 to 3) will be described. In the following, the same reference numerals are assigned to the same components as those in the embodiment without duplicated explanation.

[Modification 1]

Figure 12:
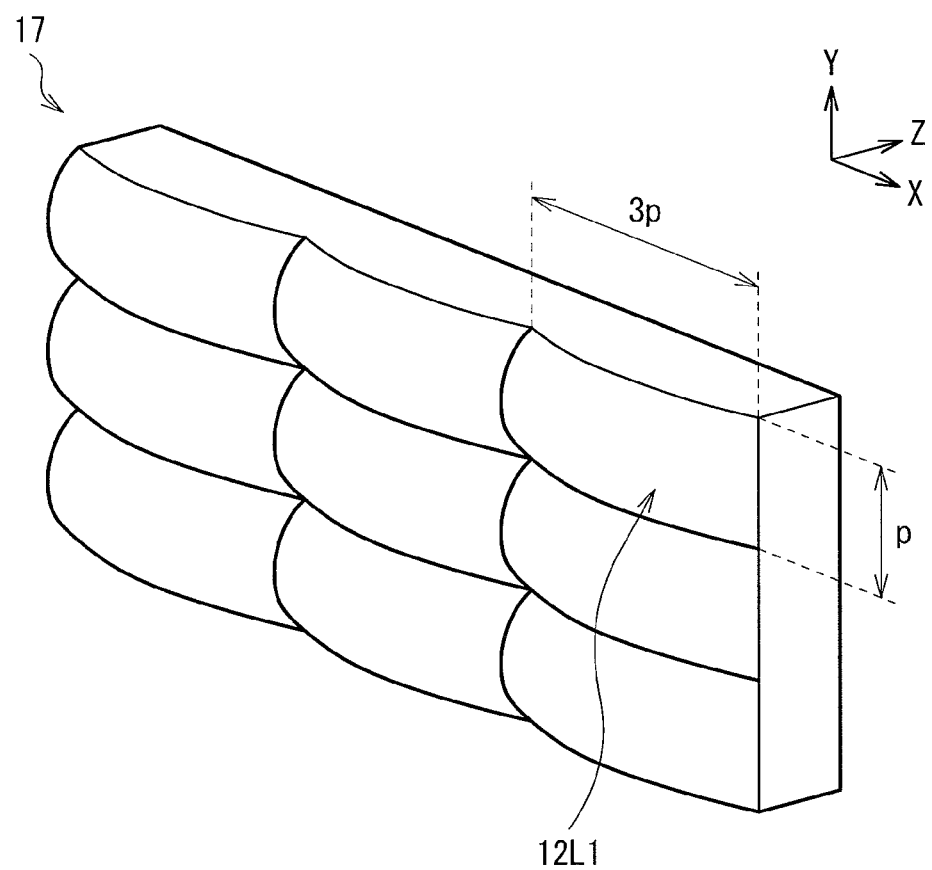
FIG. 12 is a schematic view illustrating a rough configuration of a lens array according to modification 1.

FIG. 12 is a schematic view illustrating a rough configuration of a lens array (lens array 17) according to modification 1. In the lens array 17, toroidal lenses 12L1 as a plurality of lens sections are provided only on a light incident surface (or light exiting surface) unlike the lens array 12 in the embodiment. Each toroidal lens 12L1 has a dimension n times (here, three times) as large as pixel width p in the lateral direction, and a dimension m times as large as (here, equal to) the pixel width p in the longitudinal direction Y. In addition, the toroidal lens 12L1 exhibits different refractive indicia: a focal distance f1 in the lateral direction X and a focal distance f2 in the longitudinal direction Y. The lens array 17 includes such toroidal lenses 12L1 arranged in an array.

In this way, the toroidal lens having refractive-index distribution may be used for the lens array 17. Even in such a case, the same effects as in the embodiment may be provided.

[Modification 2]

Figure 13:
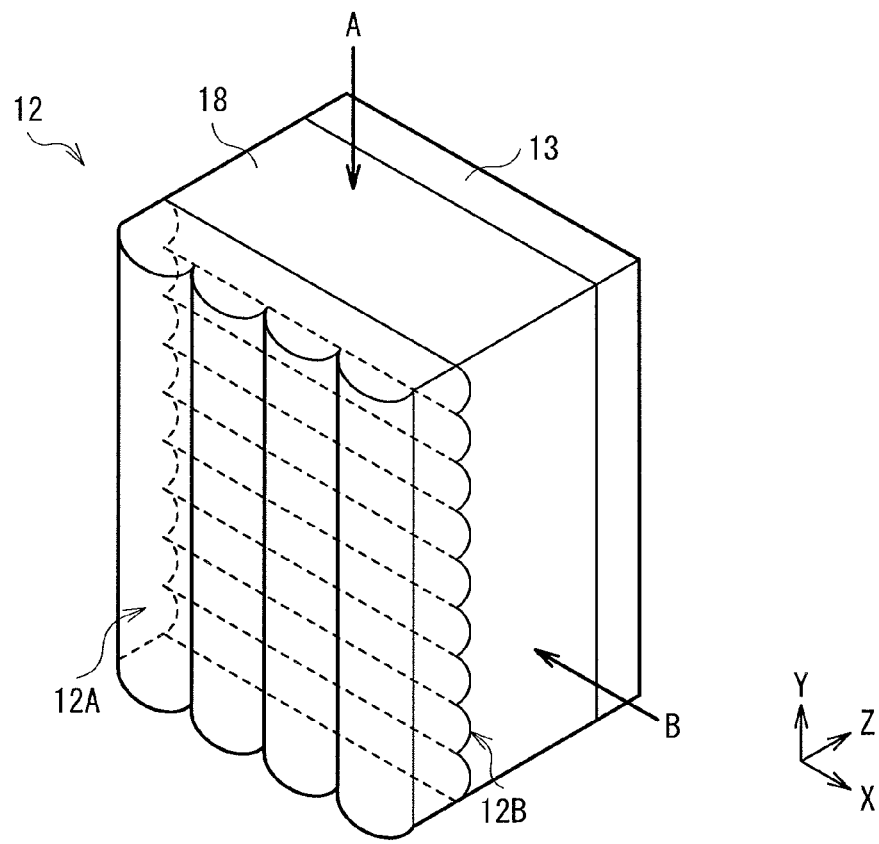
FIG. 13 is a schematic view illustrating a perspective configuration of a lens array and of an image sensor according to modification 2.
Figures 14A, 14B:
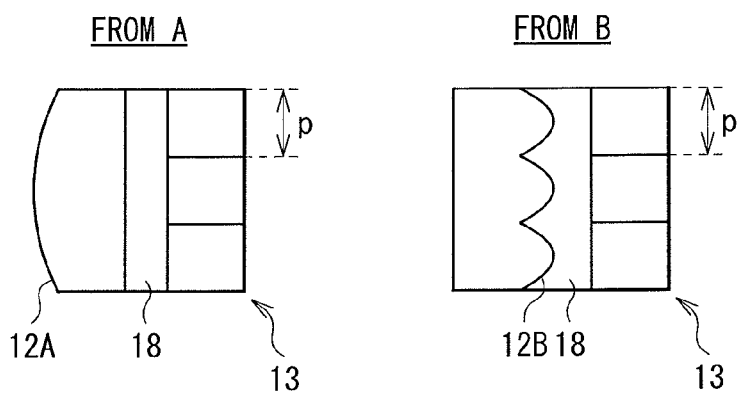
FIG. 14A is a side view from A in FIG. 13.
FIG. 14B is a side view from B therein.

FIG. 13 illustrates an arrangement relationship between a lens array 12 and an image sensor 13 according to modification 2. FIG. 14A is a side view showing the lens array 12 and the image sensor 13 as viewed from A in FIG. 13, and FIG. 3B is a side view showing the lens array 12 and the image sensor 13 as viewed from B in FIG. 13. Long-shaped convex lenses 12B are omitted in FIG. 14A, and long-shaped convex lenses 12A are omitted in FIG. 14B. In the modification, the lens array 12 is integrally formed on a light receiving surface of the image sensor 13. Specifically, in the modification, the lens array 12 is laminated on the image sensor 13 with a resin layer 18 in between. Such a laminated structure may be formed, for example, in the following way. First, a resin layer 18 is formed on the image sensor 13, and then the long-shaped convex lenses 12B are formed using the method described before. On the other hand, the long-shaped convex lenses 12A are formed on a substrate such as glass substrate using the method described before. The glass substrate, having the long-shaped convex lenses 12A formed thereon, is laminated on the long-shaped convex lenses 12B while being aligned therewith, so that the laminated structure is formed. Alternatively, the laminated structure may be formed as follows. That is, the long-shaped convex lenses 12A and 12B may be directly formed on the image sensor 13 using a manufacturing process of an on-tip lens, which is typically formed for each of pixels on a light receiving side of the image sensor 13.

In this way, the lens array 12 and the image sensor 13 may be integrally provided. Even in such a case, the same effects as in the embodiment may be obtained. However, in the modification, since the lens array 12 and the image sensor 13 are integrally formed, both of them hardly shift in position even after aging, making it possible to improve positional accuracy of the lens array 12 to the image sensor 13 more than in the embodiment. It is to be noted that the modification 2 may be applied to the lens array 17 including a plurality of toroidal lenses arranged two-dimensionally as in the modification 1. That is, the lens array 17 may be integrally provided on the light receiving surface of the image sensor 13.

[Modification 3]

FIGS. 15A and 15B schematically illustrate an example of a color arrangement of a color filter according to modification 3. While the example of the color filter corresponding to the 1×3 pixel region is given in the embodiment, an example of a color filter corresponding to a 1×2 pixel region is given in this modification. That is, when viewpoint images from one viewpoint in the longitudinal direction and from two viewpoints in the lateral direction are acquired, for Bayer arrangement, one of R, G, and B may be disposed at every 1×2 pixel region (the same color in one pixel region), for example, as illustrated in FIG. 15B, or respective colors may be disposed such that the same colors are not next to each other as illustrated in FIG. 15A. While Bayer arrangement is provided in both cases after image composition is performed for each of the viewpoints, a color arrangement is made such that the same color pixels are not next to each other as illustrated in FIG. 15A, suppressing crosstalk between beams in different viewpoint directions.

While the disclosure has been described with the embodiment and the modifications hereinbefore, the disclosure is not limited to the above embodiment and the like, and various modifications and alterations may be made. For example, while the embodiment has been described with the case, as an example, where lens-corresponding-pixels (pixel region) of m×n=1×3 (or 1×2) are used, the pixel region set in correspondence to each lens is not limited to this. For example, a pixel region with m=1 and n=4 or more, or with m=2 and n=3 or more may be used. In addition, the number of viewpoints is not limited to the case where the number is large in the lateral direction compared with in the longitudinal direction, and may be set such that the number is large in the longitudinal direction compared with in the lateral direction.

Moreover, while the embodiment and the like have been described with the case where the image pickup unit has the image processing section to generate viewpoint images, the image processing section may not be necessarily internally provided. In addition, viewpoint image generation processing is not limited to the above, and a viewpoint image may be generated using another image processing method.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An image pickup unit comprising:
an image pickup lens;
a lens array disposed on an image formation plane of the image pickup lens; and
an image pickup device having a plurality of pixels arranged two-dimensionally along first and second directions intersecting each other,
wherein the lens array includes a plurality of lens sections each being assigned to a region of m- by n-pixel in the image pickup device, where each of m and n is an integer of 1 or more, and m is different from n, and
wherein the lens array includes a plurality of first long-shaped convex lenses each extending along the first direction on a light incident side, and each having a width n times as large as a pixel width along the second direction, and
a plurality of second long-shaped convex lenses each extending along the second direction on a light exiting side, and each having a width m times as large as a pixel width along the first direction,
wherein the plurality of lens sections are formed in regions corresponding to intersections of the first and second long-shaped convex lenses, respectively.

2. The image pickup unit according to claim 1, wherein the lens array is disposed to allow each of focal planes of the first and second long-shaped convex lenses to correspond to a light receiving surface of the image pickup device.

3. The image pickup unit according to claim 2, wherein a thickness and a position of the lens array are set to satisfy the following expression (1), where f1 represents a focal distance of each of the first long-shaped convex lenses, and f2 represents a focal distance of each of the second long-shaped convex lenses, $$f1=(n/m)\times f2 \qquad (1).$$

4. The image pickup unit according to claim 1, wherein each of the plurality of lens sections is configured of a toroidal lens.

5. The image pickup unit according to claim 1, wherein the lens array is integrally provided with the image pickup device.

6. The image pickup unit according to claim 1, wherein a color filter is disposed on a light receiving surface of the image pickup device, the color filter having a plurality of filter elements arranged in correspondence with the plurality of pixels in the image pickup device, respectively, filter elements corresponding to any adjacent pixels in the plurality of pixels having colors different from each other.

* * * * *